United States Patent
Akram et al.

(10) Patent No.: US 7,419,299 B2
(45) Date of Patent: Sep. 2, 2008

(54) METHODS OF SENSING TEMPERATURE OF AN ELECTRONIC DEVICE WORKPIECE

(75) Inventors: Salman Akram, Boise, ID (US); David R. Hembree, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 436 days.

(21) Appl. No.: 10/773,383

(22) Filed: Feb. 6, 2004

(65) Prior Publication Data

US 2004/0164372 A1 Aug. 26, 2004

Related U.S. Application Data

(60) Continuation of application No. 10/042,707, filed on May 16, 2002, now Pat. No. 6,709,878, which is a continuation of application No. 09/389,924, filed on Sep. 3, 1999, now abandoned, which is a division of application No. 09/032,184, filed on Feb. 27, 1998, now Pat. No. 6,744,346.

(51) Int. Cl.
*H01L 21/66* (2006.01)
*H01L 23/58* (2006.01)
*G01K 13/00* (2006.01)

(52) U.S. Cl. .............................. 374/137; 438/14; 257/48

(58) Field of Classification Search ................. 430/311, 430/327; 438/14–16; 374/137; 357/48; 257/48

See application file for complete search history.

(56) References Cited

U.S. PATENT DOCUMENTS

| | | |
|---|---|---|
| 3,440,407 A | 4/1969 | Golstos et al. |
| 3,614,345 A | 10/1971 | Quinn |
| 3,683,306 A | 8/1972 | Bulthuis et al. |
| 3,710,251 A | 1/1973 | Hagge et al. |

(Continued)

FOREIGN PATENT DOCUMENTS

FR 2336778 7/1977

(Continued)

OTHER PUBLICATIONS

Advertisement for Probe Technology from the Web Page of Interconnect Devices, Inc; Mar. 6, 1998, 1 page.

(Continued)

*Primary Examiner*—Evan Pert
(74) *Attorney, Agent, or Firm*—Wells St. John, P.S.

(57) ABSTRACT

The present invention includes electronic device workpieces, methods of semiconductor processing and methods of sensing temperature of an electronic device workpiece. In one aspect, the invention provides an electronic device workpiece including: a substrate having a surface; a temperature sensing device borne by the substrate; and an electrical interconnect formed upon the surface of the substrate, the electrical interconnect being electrically coupled with the temperature sensing device. In another aspect, a method of sensing temperature of an electronic device workpiece includes: providing an electronic device workpiece; supporting a temperature sensing device using the electronic device workpiece; providing an electrical interconnect upon a surface of the electronic device workpiece; electrically coupling the electrical interconnect with the temperature sensing device; and sensing temperature of the electronic device workpiece using the temperature sensing device.

41 Claims, 6 Drawing Sheets

U.S. PATENT DOCUMENTS

| | | | |
|---|---|---|---|
| 4,006,909 | A | 2/1977 | Ollendorf et al. |
| 4,284,872 | A * | 8/1981 | Graeme ................. 219/121.69 |
| 4,332,081 | A | 6/1982 | Francis |
| 4,355,463 | A | 10/1982 | Burns |
| 4,356,379 | A * | 10/1982 | Graeme ..................... 219/209 |
| 4,518,944 | A | 5/1985 | Faris |
| 4,560,216 | A | 12/1985 | Egawa |
| 4,703,555 | A | 11/1987 | Hubner |
| 4,754,555 | A | 7/1988 | Stillman |
| 4,802,099 | A * | 1/1989 | Logue ......................... 716/19 |
| 4,818,327 | A | 4/1989 | Davis |
| 4,888,988 | A | 12/1989 | Lee et al. |
| 4,912,600 | A | 3/1990 | Jaeger et al. |
| 5,141,334 | A | 8/1992 | Castles |
| 5,325,052 | A | 6/1994 | Yamashita |
| 5,347,869 | A | 9/1994 | Shie et al. |
| 5,378,311 | A | 1/1995 | Nagayama et al. |
| 5,406,109 | A | 4/1995 | Whitney |
| 5,435,646 | A | 7/1995 | McArthur et al. |
| 5,436,494 | A | 7/1995 | Moslehi |
| 5,437,189 | A | 8/1995 | Brown et al. |
| 5,446,437 | A | 8/1995 | Bantien et al. |
| 5,475,317 | A | 12/1995 | Smith |
| 5,478,242 | A | 12/1995 | Walker et al. |
| 5,492,011 | A | 2/1996 | Amano et al. |
| 5,495,667 | A | 3/1996 | Farnworth et al. |
| 5,522,215 | A * | 6/1996 | Matsunaga et al. |
| 5,550,526 | A | 8/1996 | Mottahed |
| 5,551,283 | A | 9/1996 | Manaka et al. |
| 5,557,215 | A | 9/1996 | Saeki et al. |
| 5,612,574 | A | 3/1997 | Summerfelt et al. |
| 5,645,764 | A | 7/1997 | Angelopoulos et al. |
| 5,670,066 | A | 9/1997 | Barnes et al. |
| 5,703,287 | A | 12/1997 | Treutler et al. |
| 5,708,250 | A | 1/1998 | Benjamin et al. |
| 5,719,333 | A | 2/1998 | Hosoi et al. |
| 5,746,513 | A * | 5/1998 | Renken ..................... 374/179 |
| 5,830,372 | A | 11/1998 | Hierold |
| 5,831,333 | A | 11/1998 | Malladi et al. |
| 5,886,863 | A | 3/1999 | Nagasaki et al. |
| 5,919,548 | A | 7/1999 | Barron et al. |
| 5,945,834 | A | 8/1999 | Nakata et al. |
| 5,964,395 | A | 10/1999 | Glovatsky et al. |
| 5,969,639 | A | 10/1999 | Lauf et al. |
| 6,004,471 | A | 12/1999 | Chuang |
| 6,020,750 | A | 2/2000 | Berger et al. |
| 6,037,645 | A * | 3/2000 | Kreider ..................... 357/467 |
| 6,051,453 | A * | 4/2000 | Takemura ................... 438/166 |
| 6,121,061 | A | 9/2000 | Van Bilsen et al. |
| 6,190,040 | B1 * | 2/2001 | Renken et al. ............. 374/185 |
| 6,293,698 | B1 * | 9/2001 | Alvis ........................ 374/164 |
| 6,325,536 | B1 * | 12/2001 | Renken et al. ............. 374/161 |
| 6,377,060 | B1 | 4/2002 | Burkhart et al. |
| 6,411,116 | B1 * | 6/2002 | DeHaven et al. ............ 324/765 |
| 6,577,148 | B1 * | 6/2003 | DeHaven et al. ............ 324/765 |
| 6,635,852 | B1 * | 10/2003 | Seiwa ......................... 219/390 |
| 6,645,701 | B1 * | 11/2003 | Ota et al. |
| 6,709,878 | B2 * | 3/2004 | Akram et al. |
| 6,865,080 | B2 * | 3/2005 | Radosevich et al. |
| 6,936,849 | B1 | 8/2005 | Forbes et al. |

FOREIGN PATENT DOCUMENTS

| | | |
|---|---|---|
| JP | 56-12521 | 2/1981 |
| JP | 2-268462 | 11/1990 |
| JP | 6-310580 | * 11/1994 |

OTHER PUBLICATIONS

Good Things Come in Small BGA/CSP Packages from Johnstech International, Corporation; Advertisment; Mar. 6, 1998 1 page.

Product Description for Test Socket Contacts from the Web Page of Johnstech International, Corporation; www.johnstech.com; Mar. 5, 1998; 1 page.

Product Description for Double Ended Probes, B1052 Series, from the Web Page of Rika Denshi america, Inc; www.testprobe.com; Feb. 4, 1998, 1 page.

Product Description for Test Centers, RM-500 Series Probes, from the Web Page of Rika Denshi America, Inc.; www.testprobes.com; Feb. 4, 1998, 1 pages.

Product Description for Cost Effective Interconnections for High I/O Products from the Web Page of Rika Denshi America, Inc.; www.testprobe.com; Feb. 4, 1998, 1 page.

Product Description for Thermistors from Web Page of Therm-O-Disc, Inc., 2 pages.

Product Description for RTD Sensors from Web Page of MTI Industrial Sensors, 3 pages.

*Temperature Metrology for CD Control in DUV Lithography*, Jeffrey Parker and Wayne Renken, pp. 111-112, 114, 116, Sep. 17, 1997.

Product Description for RTD Modules from Web Page of Dataq Instruments, 2 pages.

Product Description for RTD from Web Page of Minco Products Inc., 1 page (1996).

Product Description for Ball Grid Probe B1303-C3 from the Web Page of Rika Denshi America, Inc.; www.testprobe.com; Feb. 4, 1998, 1 page.

P. Van Zant; "Microchip Fabrication;" (4th ed. 2000); pps 567-569.

"Silicon Processing for the VLSI Era", vol. 1: Process Technology, $2^{nd}$ Edition, Stanley Wolf, Ph.D. & Richard N. Tauber Ph.D., Lattice Press 2000, pp. 22-34.

*Application Guide Temperature Sensors*, Watlow Electrical Manufacturing Company Catalog, pp. 775-778, 1992/1993.

*In-Situ survey System of Resistive and Thermoelectric Properties of Either Pure of Mixed Materials in Thin Films Evaporated Under Ultra High Vacuum*, Lechevallier, LeHuerou, Richon, Sarrau, & Gouault, J. Phys. III France, vol. 5, pp. 409-418, Apr. 1995 (Abstract only).

* cited by examiner

METHODS OF SENSING TEMPERATURE OF AN ELECTRONIC DEVICE WORKPIECE

RELATED PATENT DATA

This patent resulted from a continuation application of and claims priority to U.S. patent application Ser. No. 10/042,707, filed May 16, 2002 now U.S. Pat. No. 6,709,878, entitled "Methods of Sensing Temperature of an Electronic Device Workpiece and Methods of Semiconductor Processing", naming Salman Akram et al. as inventors, which is a continuation of U.S. patent application Ser. No. 09/389,924, filed Sep. 3, 1999 now abandoned, entitled "Methods of Sensing Temperature of an Electronic Device Workpiece and Methods of Semiconductor Processing", naming Salman Akram et al. as inventors, which was a divisional application of U.S. patent application Ser. No. 09/032,184, filed Feb. 27, 1998 now U.S. Pat. No. 6,744,346, entitled "Electronic Device Workpieces, Methods of Semiconductor Processing and Methods of Sensing Temperature of an Electronic Device Workpiece", naming Salman Akram et al. as inventors, the disclosures of which are incorporated by reference.

TECHNICAL FIELD

The present invention relates to electronic device workpieces, methods of semiconductor processing and methods of sensing temperature of an electronic device workpiece.

BACKGROUND OF THE INVENTION

It is preferred in the semiconductor and related arts to utilize large wafers for fabrication of integrated circuits and other devices. Large wafers are preferred inasmuch as an increased number of chips can be fabricated from larger workpieces. As the size of the wafers continues to increase as processing techniques are improved, additional processing obstacles are presented.

For example, it is typically preferred to provide a substantially constant temperature across the surface of the wafers being processed because changes in temperature can influence device fabrication. Wafers of increased diameters and surface areas experience increased temperature fluctuations at various locations on the workpiece. In particular, a partial vacuum is typically used to pull small diameter wafers into direct thermal contact with a hot plate. Such processing methods facilitate substrate temperature control because the substrate temperature is closely associated to the temperature of the hot plate. Fabrication of small sub-micron devices upon larger diameter semiconductor wafers or workpieces requires minimal backside contamination. As such, contact of the workpiece with a hot plate is not typically not possible. Such workpieces are processed in conventional operations upon spacers or pins that position the workpiece approximately 0.1 millimeters above the hot plate heating surface. Such spacing intermediate a chuck or hot plate and the workpiece results in substrate temperatures which can be influenced by the environment above the substrate. Inconsistencies in temperature across the surface of the workpiece often result.

Absolute temperature and temperature uniformity of a workpiece are parameters which are closely monitored during wafer and workpiece fabrication to provide critical dimension (CD) control. Chemically amplified resists are utilized in deep ultraviolet (DUV) lithography in small micron geometries (eg., 0.25 microns and below). Chemically amplified resists are particularly temperature dependent further increasing the importance of temperature control and monitoring. Some thermal resist processing steps require process windows ranging from 1–2 degrees centigrade down to a few tenths of a degree centigrade. Meteorology that is four to ten times more precise than conventional process equipment may be required to provide thermal performance measurements to 0.1 degrees centigrade.

One approach has disclosed the use of temperature sensors across a surface of the wafer to provide temperature mapping of the workpiece during processing. Platinum foil leads and copper leads are utilized to electrically connect the temperature sensors. With the use of numerous temperatures sensors across an entire workpiece surface, numerous wires are required for coupling and monitoring. Such numerous wired connections can break and/or adversely impact processing of the workpiece or the temperature measurements taken of the surface of the workpiece. Some temperature sensors require four leads per sensor further impacting the processing and temperature monitoring of the workpieces.

Therefore, there exists a need to provide improved temperature monitoring of workpieces which overcomes the problems experienced in the prior art.

SUMMARY OF THE INVENTION

The present invention includes electronic device workpieces, methods of semiconductor processing and methods of sensing temperature of an electronic device workpiece. Exemplary electronic device workpieces include semiconductor wafers.

One electronic device workpiece includes a substrate having an upper surface and a temperature sensing device borne by the substrate. The temperature sensing device can comprise a preexisting device. Alternatively, the temperature sensing device can be formed upon a surface of the electronic device workpiece. The temperature sensing device comprises a resistance temperature device (RTD) in one embodiment. A plurality of temperature sensing devices are provided in temperature sensing relation with the electronic device workpiece in an exemplary embodiment.

An electrical interconnect is preferably provided upon the surface of the substrate. The electrical interconnect comprises a conductive trace in a preferred embodiment. The electrical interconnect is electrically coupled with the temperature sensing device. The electrical interconnect can be wire bonded to or physically coupled with the temperature sensing device. The electrical interconnect can be configured to couple the temperature sensing device with an edge of the electronic device workpiece. An interface can be provided to couple the electrical interconnects with external circuitry. Exemplary electrical circuitry includes a data gathering device, such as a digital computer.

An isolator is formed intermediate the temperature sensing device and electrical interconnect, and the substrate of the electronic device workpiece in one embodiment. The isolator provides electrical isolation. An exemplary isolator comprises silicon dioxide.

Temperature sensing devices are provided within a cavity formed within the substrate of the electronic device workpieces according to another embodiment. The cavity is preferably formed by an anisotropic etch forming sidewalls at an approximate angle of fifty-four degrees with respect to the surface of the substrate. Alternatively, temperature sensing devices are formed or positioned upon a surface of the electronic device workpiece.

The electronic device workpiece comprises a calibration workpiece in one embodiment. In another embodiment, the electronic device workpiece comprises a workpiece which undergoes processing from which subsequent devices are formed, such as a silicon wafer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
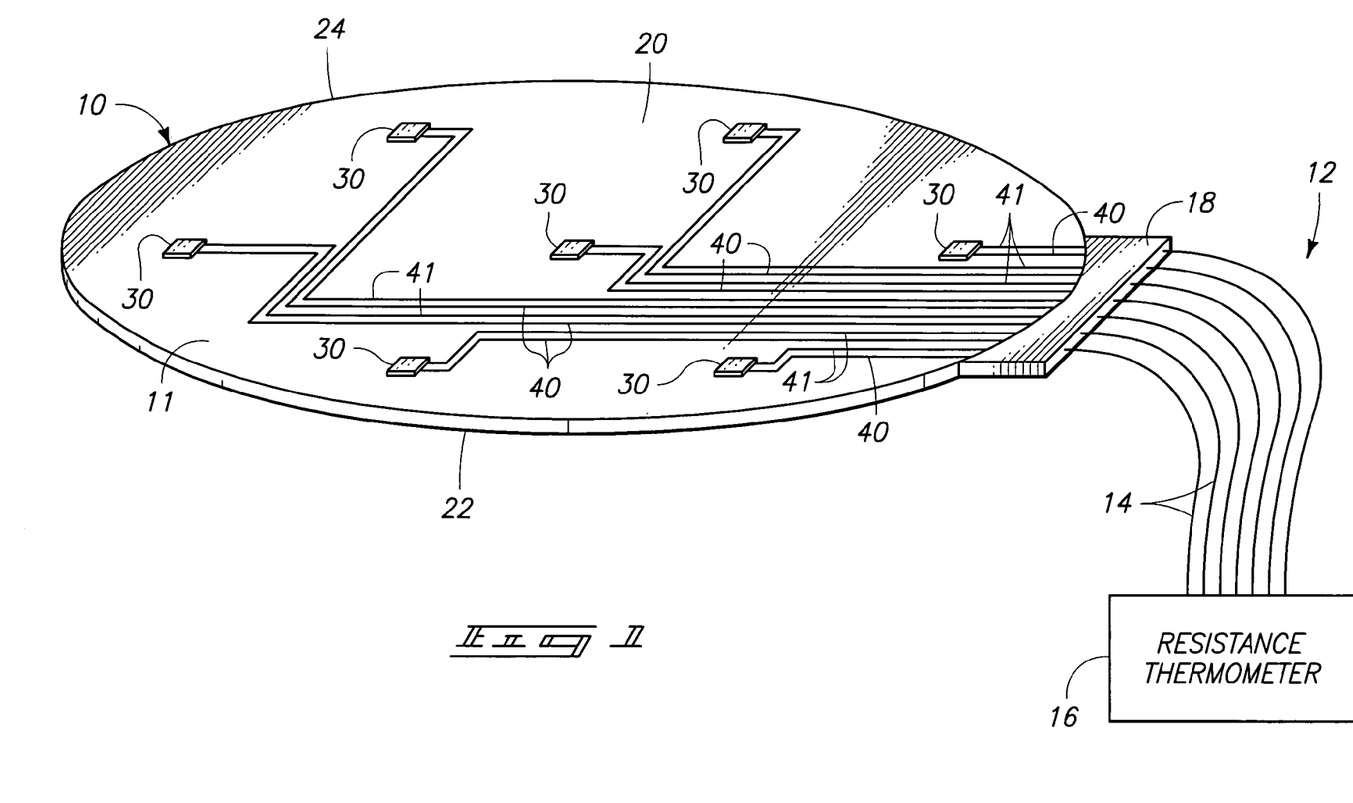
FIG. 1 is an isometric view of an electronic device workpiece having a plurality of temperature sensing devices.

Referring to FIG. 1, an electronic workpiece 10 is illustrated. Exemplary electronic device workpieces include a semiconductor wafer or a crystal mask substrate. In one embodiment, electronic device workpiece 10 includes a substrate 11 comprising a semiconductive substrate. Substrate 11 can comprise silicon, silicon carbide and gallium nitride. Alternatively, electronic device workpiece 10 can comprise other substrates. In particular, electronic device workpiece 10 can comprise other components configured for application within an electronic or electrical device or configured for processing to form such components.

Electronic device workpiece 10 is coupled with external circuitry 12. The illustrated external circuitry 12 includes plural connections 14 and a resistance thermometer 16. An interface 18 is provided in a preferred embodiment to provide convenient coupling of circuitry formed upon electronic device workpiece 10 and electrical connections 14 of circuitry 12.

External circuitry 12 can be implemented in other configurations. For example, resistance thermometer 16 comprises a data gathering device in alternative embodiments. Connections 14 are configured to couple electronic device workpiece 10 with a digital computer configured to monitor process conditions including the temperature of electronic device workpiece 10. External circuitry 12 includes communication devices in other embodiments of the invention to transmit process conditions.

Electronic device workpiece 10 includes an upper surface 20 and lower surface 22 opposite upper surface 20. Electronic device workpiece 10 additionally includes an edge 24 which is circular in the described embodiment.

According to the present invention, at least one temperature sensing device 30 is provided upon at least one surface of electronic device workpiece 10. A plurality of temperature sensing devices 30 are provided upon electronic device workpiece 10 in a preferred embodiment. In the illustrated embodiment, a plurality of temperature sensing devices 30 are provided upon or supported by upper surface 20 of electronic device workpiece 10. Temperature sensing devices 30 are preferably borne by substrate 11 of electronic device workpiece 10 and may be formed upon lower surface 22 as well as upper surface 20.

In one embodiment, temperature sensing devices 30 comprise resistance temperature devices (RTD). Resistance temperature devices provide contact temperature sensing in preferred modes of operation. In particular, resistance temperature devices can comprise a wire wound device that provides a linear resistance change for a corresponding temperature change. Typically, the coefficient of temperature of resistance temperature devices is positive wherein the resistance through the resistance temperature device increases as temperature increases.

Exemplary resistance temperature devices comprise sensitive materials which provide a plurality of resistances corresponding to a temperature profile. Resistance temperature devices can comprise platinum, polysilicon or other sensitive materials.

In another embodiment, temperature sensing devices 30 comprise diodes which provide a change in threshold voltage responsive to temperature changes. Such voltage changes are sufficient to enable monitoring of associated temperatures and extraction of temperature information. Other temperature sensing devices 30 comprise thermocouples which comprise two overlapping dissimilar metals to create a voltage producing junction which varies dependent upon temperature exposure. Further temperature sensing devices 30 include a thermistor which comprises a mixture of metal oxides and encapsulated in an isolator such as epoxy or glass.

As described in detail below, temperature sensing devices 30 can be fabricated or formed upon the electronic device workpiece 10 or comprise preexisting devices which are positioned and adhered upon or attached to the electronic device workpiece 10. Fabricated temperature sensing devices 30 are available from Watlow Electrical Manufacturing Company of St. Louis, Mo.

Electrical interconnects 40, 41 are provided to electrically couple with individual temperature sensing devices 30. In a preferred embodiment, electrical interconnects 40, 41 are formed upon upper surface 20 of substrate 11. In embodiments where plural temperature sensing devices 30 are provided, individual electrical interconnects 40, 41 are individually coupled with respective temperature sensing devices 30.

Electrical interconnects 40, 41 are formed upon upper surface 20 of substrate 11 in one embodiment. Such formed electrical interconnects 40 preferably comprise conductive traces. The conductive traces can comprise aluminum or other conductive materials. The conductive traces are formed by sputtering in one fabrication method. Electrical interconnects 40, 41 can comprise other conductors in other embodiments. Electrical interconnects 40, 41 electrically couple individual temperature sensing devices 30 with edge 22 of electronic device workpiece 10.

An isolator (not shown in FIG. 1) is provided intermediate upper surface 20 and temperature sensing devices 30 and electrical interconnects 40, 41. The isolator comprises silicon dioxide or other suitable insulative material.

Interface connection 18 is provided in electrical connection with electrical interconnects 40, 41. The depicted interface connection 18 is located proximate to edge 22 of electronic device workpiece 10. Interface connection 18 is configured to provide electrical coupling of electrical interconnects 40, 41 and the respective temperature sensing devices 30 with circuitry 12 external of electronic device workpiece 10. Exemplary interface connection configurations include tab tape, adapter, flip chip connections, wire bond connections, and conductive adhesives. Interface connection 18 can include other configurations in accordance with the present invention.

Figure 1A:
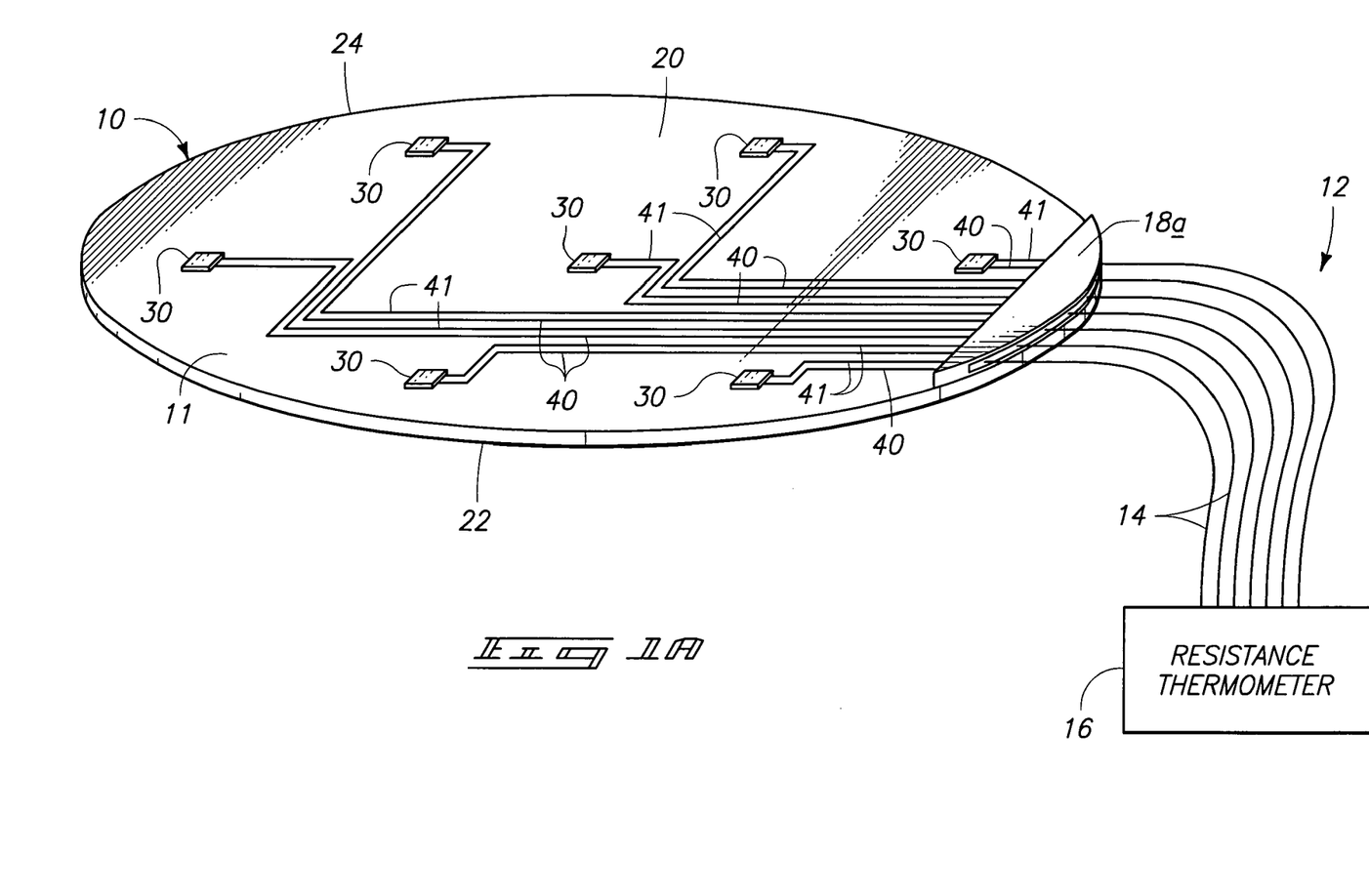
FIG. 1A is an isometric view of an alternative electronic device workpiece.

Referring to FIG. 1A, an alternative interface connection 18a is illustrated. Connection 18a provides electrical coupling of temperature sensing devices 30 with electrical circuitry 12. The depicted interface connection 18a is defined by edge 24 of workpiece 10.

Figure 1B:
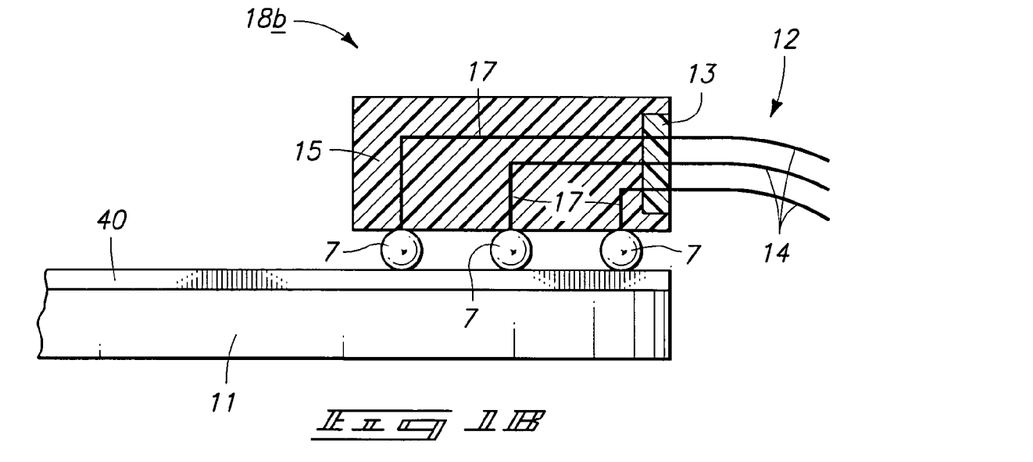
FIG. 1B is a cross-sectional view of one configuration of an interface of the electronic device workpiece.

Referring to FIG. 1B, yet another interface connection 18b is illustrated. The depicted interface connection 18b comprises respective mating plug and receptacle components 13, 15. Plug component 13 is coupled with wires 14 of external circuitry 12 (although three wires 14 are shown in FIG. 1B, additonal wires of circuitry 12 can be coupled with plug 13). Plug 13 is configured for removable coupling with component 15.

Receptacle component 15 is configured to receive plug 13 and for attachment to electrical interconnections 40, 41 (only one interconnection 40 is shown in FIG. 1B). When mated, components 13, 15 couple external circuitry 12 with respective interconnections 40, 41.

A plurality of interconnects 7 are used in the depicted embodiment to couple internal electrical connections 17 of components 13, 15 with interconnections 40, 41. Exemplary interconnects 7 include solder, solder balls, conductive epoxy, etc.

Figure 2:
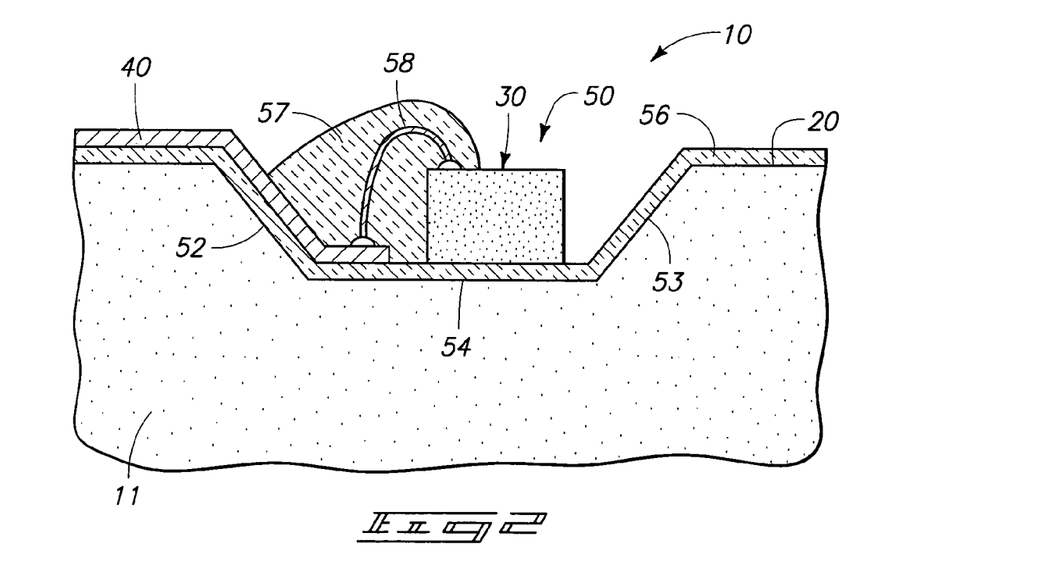
FIG. 2 is a cross-sectional view of a first embodiment of a temperature sensing device upon the electronic device workpiece.

Referring to FIG. 2, electronic device workpiece 10 includes a cavity 50 formed within substrate 11. Cavity 50 includes plural sloping sidewalls 52, 53 and a bottom wall 54. Surface 20 of substrate 11 includes sidewalls 52, 53, and bottom wall 54. An exemplary cavity 50 has a depth of approximately 200 microns and bottom wall 54 has a width of approximately 300 microns.

Cavity 50 is preferably formed by an anisotropic etch. An exemplary anisotropic etch includes potassium hydroxide (KOH). Utilization of an anisotropic etch provides sloping sidewalls 52, 53 within cavity 50. Provision of sloping sidewalls 52, 53 facilitates fabrication of conductors 40, 41 over surface 20 and isolator 56, and sidewalls 52, 53 of cavity 50. Sidewalls 52, 53 are preferably sloped at an angle within the approximate range of 50 to 60 degrees with respect to upper surface 20 of substrate 11. The most preferred embodiment provides sidewalls 52, 53 having an angle of 54 degrees with respect to upper surface 20.

Cavity 50 is formed by an isotropic etch in an alternative embodiment. Wire bonded connections are preferably utilized in such an embodiment to provide electrical coupling of interconnects 40, 41 upon surface 20 with the temperature sensing device 30 provided within cavity 50.

One temperature sensing device 30 is shown borne by substrate 11 of electronic device workpiece 10. An isolation layer 56 is shown over electronic device workpiece 10. Isolator 56 is formed over upper surface 20 of substrate 11 including sidewalls 52, 53 and bottom wall 54 of cavity 50.

A preexisting temperature sensing device 30 is positioned and adhered within cavity 50 in the depicted embodiment of FIG. 2. Temperature sensing device 30 is adhered using standard thermal conductive epoxies or adhesives in one embodiment. A temperature sensing device is formed within cavity 50 in other embodiments described below. Bottom wall 54 supports temperature sensing device 30 in the depicted embodiment. Temperature sensing device 30 is supported by upper surface 20 of substrate 11 in other embodiments.

Electric interconnects or conductive traces 40, 41 are formed over upper surface 20 and sidewall 52 in the depicted embodiment (only conductive trace 40 is shown in FIG. 2). The illustrated electrical interconnect 40 is provided over a portion of bottom wall 54. An additional electrical connection 58 is utilized to electrically couple temperature sensing device 30 with conductive trace or electrical interconnect 40. In one embodiment, electrical connection 58 comprises a wire connection, such as that formed by wire bonding. Other forms of connections such as tab tape and flip chip connections can also be employed. Connection 58 is preferably encapsulated to minimize damage to connection 58. A dispensed epoxy 57 is utilized in one embodiment to encapsulate connection 58. As shown, it is preferred to leave a portion of the area adjacent temperature sensing device 30 free of epoxy for accurate temperature sensing.

In other embodiments, contacting of conductive trace 40 with temperature sensing device 30 is sufficient to electrically couple trace 40 and temperature sensing device 30.

Figure 2A:
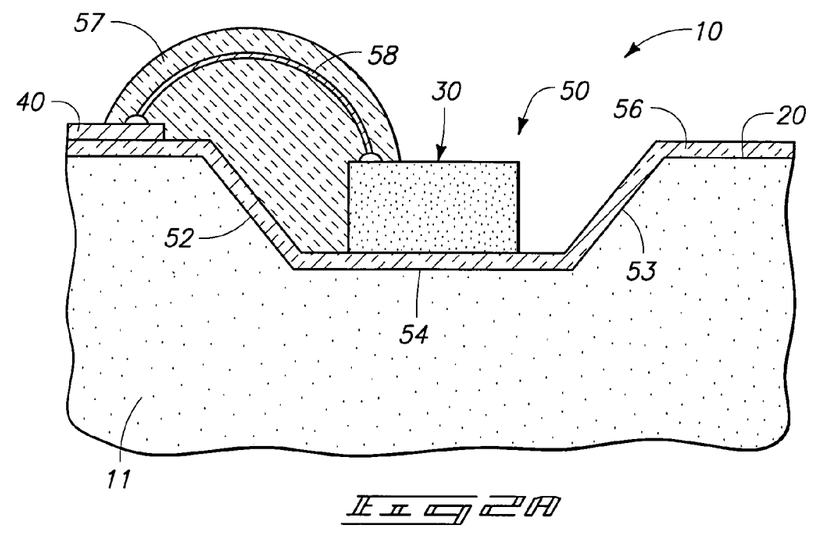
FIG. 2A is a cross-sectional view of an alternative configuration of an electrical connection coupled with the temperature sensing device shown in FIG. 2.

Referring to FIG. 2A, the illustrated electrical interconnection 40 is formed outside of cavity 50. Connection 58 is used to couple temperature sensing device 30 with the depicted interconnection 40 at a location upon interconnection 40 outside of cavity 50.

Temperature sensing device 30 is preferably provided upon electronic device workpiece 10 in a temperature sensing relation with respect to electronic device workpiece 10. Temperature sensing device 30 is configured to sense the temperature of an area of electronic device workpiece 10 immediately adjacent the attached device 30. In one embodiment, the resistance of temperature sensing device 30 changes corresponding to changes in temperature. Such changes in resistance change the voltage drop across temperature sensing device 30 thereby changing signals (for example the currents of the signals) passing through temperature sensing device 30. The generated signals correspond to the temperature of the area of the electronic device workpiece 10 being sensed. Electrical interconnects 40, 41 conduct the generated signals to interface connection 18 and external circuitry 12 in the preferred embodiment. Exemplary external circuitry 12 contains devices that convert the received signals to localized temperatures at specific points.

Figure 3:
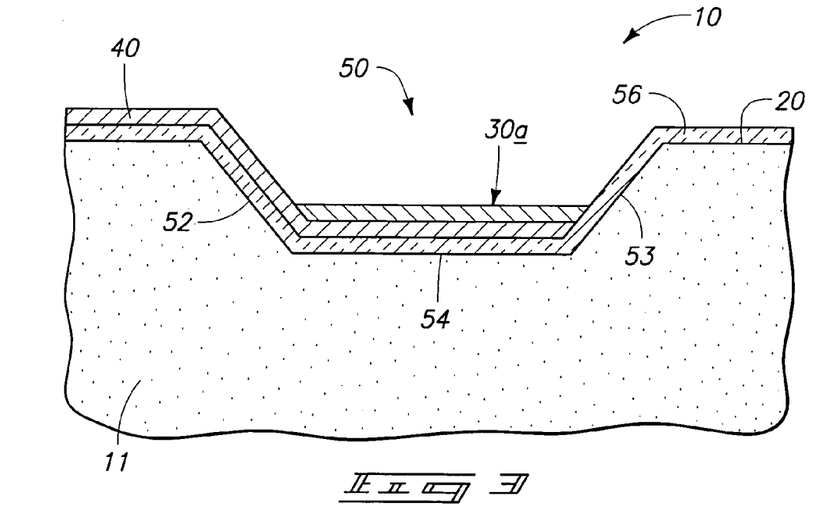
FIG. 3 is a cross-sectional view of a second embodiment of a temperature sensing device upon the electronic device workpiece.
Figure 4:
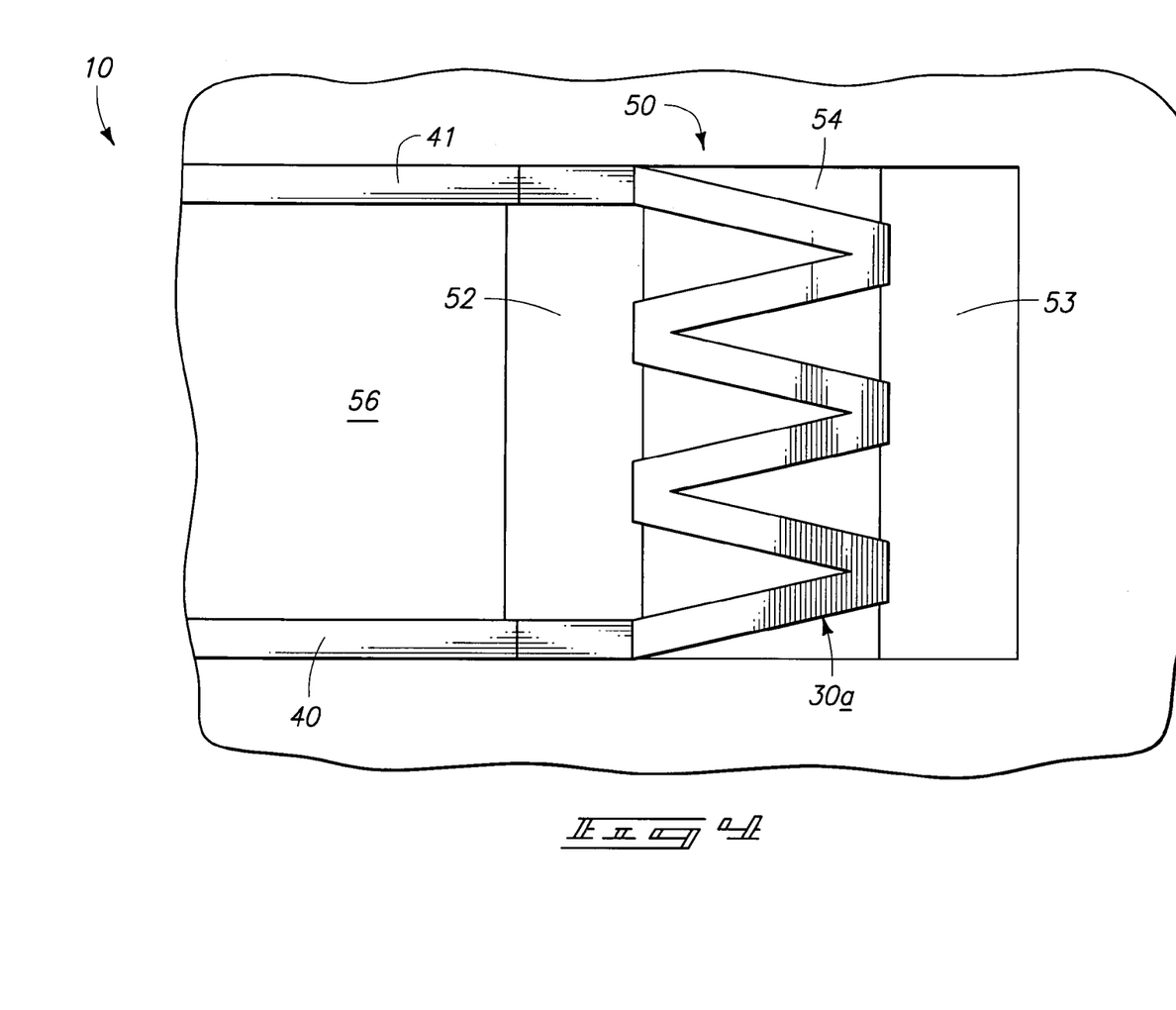
FIG. 4 is an elevated plan view of the temperature sensing device shown in FIG. 3.

Referring to FIGS. 3 and 4, like reference numerals as used herein refer to like components with any significant differences therebetween represented by an alphabetical suffix such as "a". A temperature sensing device 30a is shown formed within cavity 50 of substrate 11. Electronic device workpiece 10 includes a conductive trace 40 extending upon isolator 56 over a portion of upper surface 20, down sidewall 52 and across bottom wall 54 of cavity 50. Another conductive trace 41 is coupled with temperature sensing device 30a as shown in FIG. 4.

Temperature sensing device 30a is shown formed within cavity 50 upon conductor 40. The illustrated temperature sensing device 30a is a resistance temperature device. The resistance temperature device comprises a conductive material such as polysilicon or metals such as platinum. Other materials can also be utilized. Similarly, a combination of metals and polysilicon can also be utilized. In a preferred embodiment, temperature sensing device 30a comprises polysilicon deposited by chemical vapor deposition (CVD). The deposited polysilicon can thereafter be doped by ion implantation or diffusion to provide a desired resistivity. Alternatively, doped polysilicon using PECVD techniques can also be deposited. The polysilicon resistance temperature device can thereafter be patterned such as by etching. Electrical interconnect 40 and temperature sensing devices 30 can be formed with thin film processing techniques or thick film techniques using a stencil.

Referring to FIG. 4, the illustrated RTD temperature sensing device 30a comprises polysilicon patterned in an exemplary serpentine configuration. Temperature sensing device 30a can be configured in other shapes and formats in other embodiments. Temperature sensing device 30a is formed upon bottom wall 54 of cavity 50. Opposing ends of temperature sensing device 30a are individually coupled with plural electrical interconnects 40, 41. An electrical signal entering via one of electrical interconnects 40, 41 passes through temperature sensing device 30a and exits through the opposite electrical interconnect. A change of temperature at bottom wall 54 results in a change in resistance of temperature sensing device 30a. Accordingly, the voltage drop across temperature sensing device 30a changes with respect to fluctuations in temperature of the area of electronic device workpiece 10 adjacent device 30a. Electronic interconnects 40, 41 are configured to conduct electrical signals which indicate a temperature of electronic device workpiece 10.

Providing temperature sensing devices within cavities of the electronic device workpiece enables temperature mapping of the workpiece in three dimensions. Temperature sensing devices can be provided both on the surfaces of an electronic device workpiece and within cavities formed within the workpiece. Temperature sensing devices upon one or both surfaces of the electronic device workpiece enable temperature mapping in x-y directions upon the respective surfaces of the workpiece. Providing temperature sensing devices within cavities of the workpiece enable temperature sensing within the z direction intermediate the surfaces of the workpiece.

Figure 5:
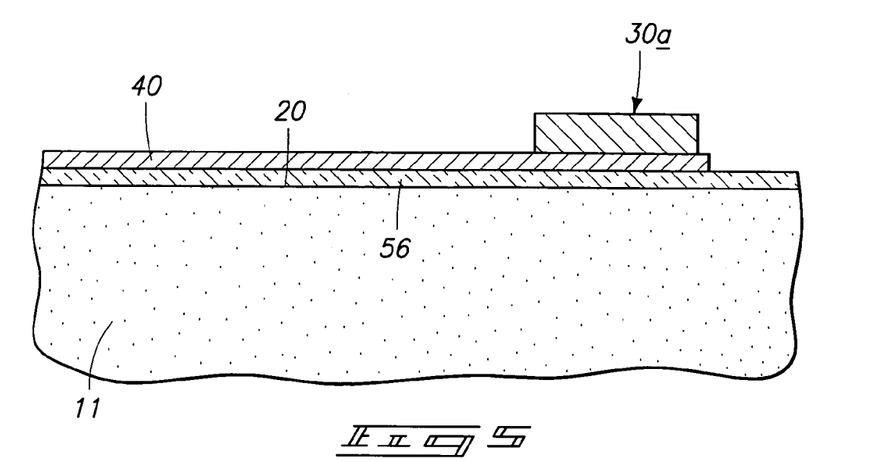
FIG. 5 is a cross-sectional view of a temperature sensing device provided upon an upper surface of the electronic device workpiece.

Referring to FIG. 5, temperature sensing device 30a is formed over surface 20 of substrate 11 of electronic device workpiece 10 and isolator layer 56. In the depicted embodiment, at least a portion of temperature sensing device 30a is formed or positioned upon electrical interconnect 40. In the depicted embodiment, temperature sensing device 30a is formed by chemical vapor deposition (CVD). In other embodiments, temperature sensing device 30a is formed by alternative processing methods. Isolator layer 56 is provided intermediate electrical interconnect 40 and upper surface 20 of substrate 11.

Figure 6:
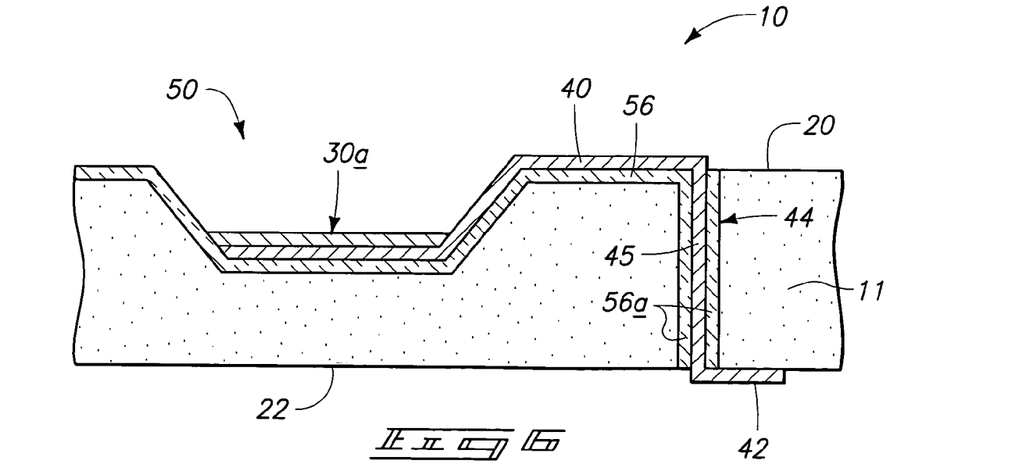
FIG. 6 is a cross-sectional view illustrating an electrical connection coupled with a temperature sensing device upon the electronic device workpiece.

Referring to FIG. 6, another construction for providing electrical connection with temperature sensing device 30a is shown. Upper surface 20 and lower surface 22 of substrate 11 are shown in FIG. 6. Electrical interconnect 40 is formed upon upper surface 20 as previously described.

The illustrated electronic device workpiece 10 also includes a via 44 formed within substrate 11. Via 44 enables electrical connection of upper surface 20 with lower surface 22. In particular, another electrical interconnection 42 is formed upon lower surface 22 of substrate 11. Via 44 is also plugged with a conductive material forming electrical interconnection 45 providing coupling of interconnections 40, 42. An insulating layer 56a is preferably formed within via 44 to provide insulation of interconnection 45.

Electrical interconnection 42 comprises a pad in the illustrated configuration. Alternatively, electrical connection 42 can be formed to extend to an edge of electronic device workpiece 10. Electrical interconnection 42 can be coupled with external circuitry (not shown in FIG. 6) enabling monitoring of temperatures of electronic device workpiece 10.

In some embodiments, the described electronic device workpiece is configured and utilized as a calibration wafer. Such calibration wafers are typically placed within a workpiece processing chamber and the chamber can be brought up to subject processing conditions at typical elevated temperatures. Through the use of an electronic device workpiece configured as a calibration wafer, the temperature at various positions upon electronic device workpieces to be processed can be determined. Thereafter, data provided by temperature sensing devices located upon the electronic device workpiece can be utilized to provide temperature control and modify some aspect of the processing chamber.

The processing chamber is preferably modified to provide a uniform temperature distribution across the entire surface of the electronic device workpiece being processed. In other processes, the processing chamber is modified to provide varied temperatures across a surface of the workpiece.

The modifications can be made with the calibration workpiece in place within the processing chamber. The effect of such modifications can be verified by the temperature sensing devices and associated temperature monitoring equipment coupled with the devices. Thereafter, the calibration workpiece is removed and the equipment having been desirably calibrated can be utilized to process other electronic device workpieces in mass.

In another embodiment, temperature sensing devices are provided upon an electronic device workpiece which will actually be processed and subsequently utilized to fabricate integrated circuitry or other components. The temperature sensing devices can be fabricated upon the electronic device workpiece during the fabrication of the electronic device workpiece. In another embodiment preexisting or prefabricated temperature sensing devices are positioned and adhered upon the electronic device workpiece.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A temperature sensing apparatus fabrication method comprising:
    forming a cavity in an electronic device workpiece;
    providing a temperature sensing device within the cavity and in a configuration to sense temperature of the electronic device workpiece;
    supporting the temperature sensing device using the electronic device workpiece;
    providing an electrical interconnect upon a surface of the electronic device workpiece; and
    electrically coupling the electrical interconnect with the temperature sensing device.

2. The method according to claim 1 wherein the electrically coupling comprises wire bonding the electrical interconnect and the temperature sensing device.

3. The method according to claim 1 wherein the forming the cavity comprises anisotropically etching the electronic device workpiece.

4. The method according to claim 1 wherein the forming the cavity comprises isotropically etching the electronic device workpiece.

5. The method according to claim 1 further comprising forming the temperature sensing device.

6. The method according to claim 5 wherein the forming the temperature sensing device comprises forming a resistance temperature device.

7. The method according to claim 1 further comprising electrically coupling the electrical interconnect with external circuitry.

8. The method according to claim 1 further comprising electrically coupling the temperature sensing device with an edge of the electronic device workpiece using the electrical interconnect.

9. The method according to claim 1 wherein the providing the electrical interconnect comprises forming a conductive trace.

10. The method according to claim 1 further comprising contacting the electrical interconnect with the temperature sensing device.

11. The method according to claim 1 wherein the sensing comprises sensing temperature of the electronic device workpiece comprising a semiconductive wafer.

12. The method according to claim 1 wherein the electronic device workpiece comprises a silicon wafer.

13. The method according to claim 1 further comprising configuring the temperature sensing device to sense the temperature of the electronic device workpiece during fabrication of an electronic device using the electronic device workpiece.

14. A temperature sensing apparatus fabrication method comprising:
providing an electronic device workpiece;
forming a plurality of temperature sensing devices over the electronic device workpiece, the temperature sensing devices being configured to sense temperature in three dimensions of the electronic device workpiece.

15. The method according to claim 13 further comprising:
providing an electrical interconnect upon the electronic device workpiece; and
electrically coupling the electrical interconnect with at least one of the temperature sensing devices.

16. The method according to claim 15 wherein the providing the electrical interconnect comprises forming a conductive trace.

17. The method according to claim 15 wherein the electrically coupling comprises wire bonding the electrical interconnect and the at least one of the temperature sensing devices.

18. The method according to claim 15 wherein the electrically coupling includes contacting the electrical interconnect and the at least one of the temperature sensing devices.

19. The method according to claim 14 further comprising:
forming a cavity in the electronic device workpiece; and
providing at least one of the temperature sensing devices within the cavity.

20. The method according to claim 19 wherein the forming the cavity comprises anisotropically etching the electronic device workpiece.

21. The method according to claim 14 wherein the forming comprises forming the temperature sensing devices individually comprising a resistance temperature device.

22. The method according to claim 14 wherein the providing the electronic device workpiece comprises providing a wafer comprising silicon.

23. The method according to claim 14 wherein the wherein the temperature sensing devices are individually configured to sense the temperature of the electronic device workpiece during fabrication of an electronic device using the electronic device workpiece.

24. A temperature sensing apparatus fabrication method comprising:
supporting a temperature sensing device using an electronic device workpiece;
providing the temperature sensing device in a temperature sensing relationship with the electronic device workpiece;
providing an electrical interconnect upon a surface of the electronic device workpiece; and
electrically coupling the electrical interconnect with the temperature sensing device comprising wire bonding the electrical interconnect and the temperature sensing device.

25. The method according to claim 24 further comprising:
forming a cavity in the electronic device workpiece; and
providing the temperature sensing device within the cavity.

26. The method according to claim 25 wherein the forming the cavity comprises anisotropically etching the electronic device workpiece.

27. The method according to claim 24 further comprising forming the temperature sensing device upon the electronic device workpiece.

28. The method according to claim 24 further comprising electrically coupling the electrical interconnect with circuitry external to the electronic device workpiece.

29. The method according to claim 24 further comprising electrically coupling the temperature sensing device with an edge of the electronic device workpiece using the electrical interconnect.

30. The method according to claim 24 wherein the providing the electrical interconnect comprises forming a conductive trace.

31. The method according to claim 24 wherein the electronic device workpiece comprises a silicon wafer.

32. The method according to claim 24 wherein the temperature sensing device is configured to sense temperature of the electronic device workpiece during fabrication of an electronic device using the electronic device workpiece.

33. A temperature sensing method comprising:
supporting a plurality of temperature sensing devices using a wafer, and wherein the temperature sensing devices are individually in a temperature sensing relationship with respect to the wafer;
exposing the wafer and the temperature sensing devices to process conditions effective to form at least one electronic device; and
sensing temperature of the wafer in three dimensions of the wafer using the temperature sensing devices during the exposing.

34. The method of claim 33 further comprising adjusting the process conditions responsive to the sensing.

35. The method of claim 33 further comprising sensing the temperature of the wafer at a plurality of positions covering substantially an entirety of a surface of the wafer.

36. The method of claim 33 wherein the wafer comprises a production wafer, and further comprising forming the at least one electronic device using the wafer during the exposing.

37. The method of claim 33 wherein the supporting comprises supporting the temperature sensing devices using the wafer comprising silicon.

38. The method of claim 33 wherein the sensing the temperature comprises sensing the temperature of the wafer during fabrication of an electronic device using the wafer.

39. A temperature sensing apparatus fabrication method comprising:
providing an electronic device workpiece;

forming a temperature sensing device over the electronic device workpiece, the forming including providing the temperature sensing device in a temperature sensing relation with the electronic device workpiece;

providing an electrical interconnect upon the electronic device workpiece;

electrically coupling the electrical interconnect with the temperature sensing device; and wherein the electrically coupling comprises wire bonding the electrical interconnect and the temperature sensing device.

40. A temperature sensing apparatus fabrication method comprising:

forming a cavity in an electronic device workpiece;

supporting a temperature sensing device using the electronic device workpiece, the supporting comprising providing the temperature sensing device within the cavity in a temperature sensing relationship with the electronic device workpiece;

providing an electrical interconnect upon a surface of the electronic device workpiece; and electrically coupling the electrical interconnect with the temperature sensing device.

41. The method according to claim 40 wherein the forming the cavity comprises anisotropically etching the electronic device workpiece.

* * * * *

UNITED STATES PATENT AND TRADEMARK OFFICE
CERTIFICATE OF CORRECTION

PATENT NO. : 7,419,299 B2
APPLICATION NO. : 10/773383
DATED : September 2, 2008
INVENTOR(S) : Akram et al.

It is certified that error appears in the above-identified patent and that said Letters Patent is hereby corrected as shown below:

In column 9, line 35, in Claim 15, delete "claim 13" and insert -- claim 14 --, therefor.

In column 9, lines 63-64, in Claim 23, after "wherein the" delete "wherein the".

Signed and Sealed this

Fourth Day of November, 2008

JON W. DUDAS
*Director of the United States Patent and Trademark Office*